(12) United States Patent
Kossel et al.

(10) Patent No.: US 8,018,312 B2
(45) Date of Patent: Sep. 13, 2011

(54) INDUCTOR AND METHOD OF OPERATING AN INDUCTOR BY COMBINING PRIMARY AND SECONDARY COILS WITH COUPLING STRUCTURES

(75) Inventors: Marcel A. Kossel, Reichenburg (CH); Thomas E. Morf, Gross (CH); Martin Leo Schmatz, Rueschlikon (CH); Jonas R. Weiss, Zurich (CH)

(73) Assignee: International Business Machines Corporation, Armonk, NY (US)

(*) Notice: Subject to any disclaimer, the term of this patent is extended or adjusted under 35 U.S.C. 154(b) by 212 days.

(21) Appl. No.: 12/369,036

(22) Filed: Feb. 11, 2009

(65) Prior Publication Data

US 2009/0201101 A1    Aug. 13, 2009

(30) Foreign Application Priority Data

Feb. 12, 2008  (EP) .................................. 08101516
Feb. 12, 2008  (EP) .................................. 08101518
Feb. 12, 2008  (EP) .................................. 08101520

(51) Int. Cl.
*H01F 5/00*  (2006.01)
(52) U.S. Cl. ........ 336/200; 336/223; 336/232; 331/167; 331/117 R
(58) Field of Classification Search .................. 336/200, 336/232, 223
See application file for complete search history.

(56) References Cited

U.S. PATENT DOCUMENTS

| | | | | |
|---|---|---|---|---|
| 4,689,803 A * | 8/1987 | Johannessen et al. | ........ | 375/304 |
| 5,029,064 A * | 7/1991 | Ball | ................................. | 363/65 |
| 5,166,597 A * | 11/1992 | Larsen et al. | ................. | 323/215 |
| 5,872,489 A * | 2/1999 | Chang et al. | ................. | 331/179 |
| 5,912,596 A * | 6/1999 | Ghoshal | .................... | 331/117 R |
| 5,952,893 A * | 9/1999 | Ghoshal | .................... | 331/108 C |
| 6,188,209 B1 * | 2/2001 | Poon et al. | .................... | 323/255 |
| 6,549,096 B2 * | 4/2003 | Groves et al. | ................. | 333/174 |
| 6,573,822 B2 * | 6/2003 | Ma et al. | ........................ | 336/223 |
| 6,815,937 B2 * | 11/2004 | Poon et al. | .................... | 323/282 |
| 6,963,729 B2 * | 11/2005 | Uozumi | .......................... | 455/42 |
| 7,432,794 B2 * | 10/2008 | Mattsson | ...................... | 336/225 |
| 7,573,356 B2 * | 8/2009 | Kawai et al. | ................. | 333/205 |
| 7,902,934 B2 * | 3/2011 | Nakamura et al. | ........... | 331/181 |

* cited by examiner

*Primary Examiner* — Anh T Mai
*Assistant Examiner* — Joselito Baisa
(74) *Attorney, Agent, or Firm* — Vazken Alexanian (57) ABSTRACT

An inductor and method of operating the inductor by combining primary and secondary coils with passive coupling, active parallel, or active cross-coupling structures. The first includes at least one passive coupling structure having at least one coupling coil arranged between a primary coil and at least one of the secondary coils and/or between two of the secondary coils. The second includes an active coupling structure arranged between a primary coil and at least one secondary coil and/or between at least two of the secondary coils, to selectively parallel couple the primary coil and one of the secondary coils and/or at least two of the secondary coils. The third includes an active coupling structure to selectively cross couple a primary coil and at least one of the secondary coils and/or to selectively cross couple at least two of the secondary coils.

11 Claims, 8 Drawing Sheets

Fig. 1 (State of the Art)

INDUCTOR AND METHOD OF OPERATING AN INDUCTOR BY COMBINING PRIMARY AND SECONDARY COILS WITH COUPLING STRUCTURES

CROSS-REFERENCE TO RELATED APPLICATION

This application claims priority under 35 U.S.C. §119 from European Patent Application No. 08101518.2 filed Feb. 12, 2008, the entire contents of which are incorporated herein by reference. This application further claims priority under 35 U.S.C. §119 from European Patent Application No. 08101516.6 filed Feb. 12, 2008, the entire contents of which are incorporated herein by reference. Still further, this application claims priority under 35 U.S.C. §119 from European Patent Application No. 08101520.8 filed Feb. 12, 2008, the entire contents of which are incorporated herein by reference.

BACKGROUND OF THE INVENTION

1. Field of the Invention

The present invention generally relates to the design of tunable inductor coils used in inductance-capacitance (Ic) tank voltage controlled oscillators (vco) and phase-locked-loop (pll) circuits. More particularly, the present invention relates to an inductor and method of operating the inductor by combining primary and secondary coils with active parallel, active cross-coupling, or passive coupling structures.

2. Description of Related Art

Phase noise and timing jitter are important in the design of oscillators and frequency synthesizers. A known method of designing high performance clock sources is to use LC-tank oscillators, which are able to achieve better phase noise performance than ring oscillators because of the higher quality factor (Q-factor) of the LC-tank. In wireline communication however where multiple standards with partially widely spaced frequency ranges often have to be covered, the application of LC VCOs is rather difficult since the tuning range of LC-tank oscillators is limited to about 30% if regular LC-tank topologies are used. It is therefore be desirable to increase the tuning range of LC-tanks to extend the frequency ranges of LC VCOs.

One way of increasing the tuning range of LC-tanks is to use more varactor (variable capacitor) banks, which would increase the variation of the capacitance in the LC tank. However, this method is limited in practice by the capacitive and resistive parasitics that occur when increasing the number of varactor banks. The additional capacitive parasitics would decrease the Cmax/Cmin-ratio of the actual tuning varactor and the resistive parasitics would degrade the quality factor disproportionately because of the longer wiring traces required to connect the different varactor banks to the inductor coil and the other devices of the LC VCO.

Moreover the peak of the quality factor of the varactor bank is at relatively low frequencies because the varactor impedance is inversely proportional to the frequency ($Z_{var} \sim 1/2\pi fC$) and the varactor quality factor decreases with increasing frequency. This is in contrast to the inductor where the peak of quality factor is typically at higher frequencies because the inductor impedance changes proportionally to the frequency ($Z_{ind} \sim 2\pi fL$). At lower frequencies the overall quality factor of the LC-tank given by $$\frac{1}{Q_{LC\_tank}} = \frac{1}{Q_{Varactor}} + \frac{1}{Q_{Inductor}} = \frac{R(Z_{LC\_tank})}{\Im(Z_{LC\_tank})}$$

is dominated by the quality factor of the inductor whereas at higher frequencies $Q_{LC\_tank}$ is mainly determined by the quality factor of the varactor. This implies that for the operation of a LC VCO at higher frequencies the tuning or band selection should preferably be performed with a tunable or switchable inductor instead of a set of switchable varactor banks as is typically implemented in state-of-the-art LC oscillators.

However, switching of inductor coils does degrade the quality factor because of the resistive losses of the closed switches. But if implemented appropriately the degradation of the quality factor is not so high so that the resulting quality factor of the switched inductor coil would not become smaller than the quality factor of the varactor bank at the frequency of interest. This statement is valid up to a certain frequency but at extremely high frequencies the LC VCO cannot operate anymore because of frequency divider limitations in a PLL circuit. Additionally other parasitics like bridging capacitances across the inductors come into play and degrade the quality factor. However, within a reasonably wide frequency range however the performance of a switchable inductor outperforms that of a switchable varactor bank.

Figure 1:
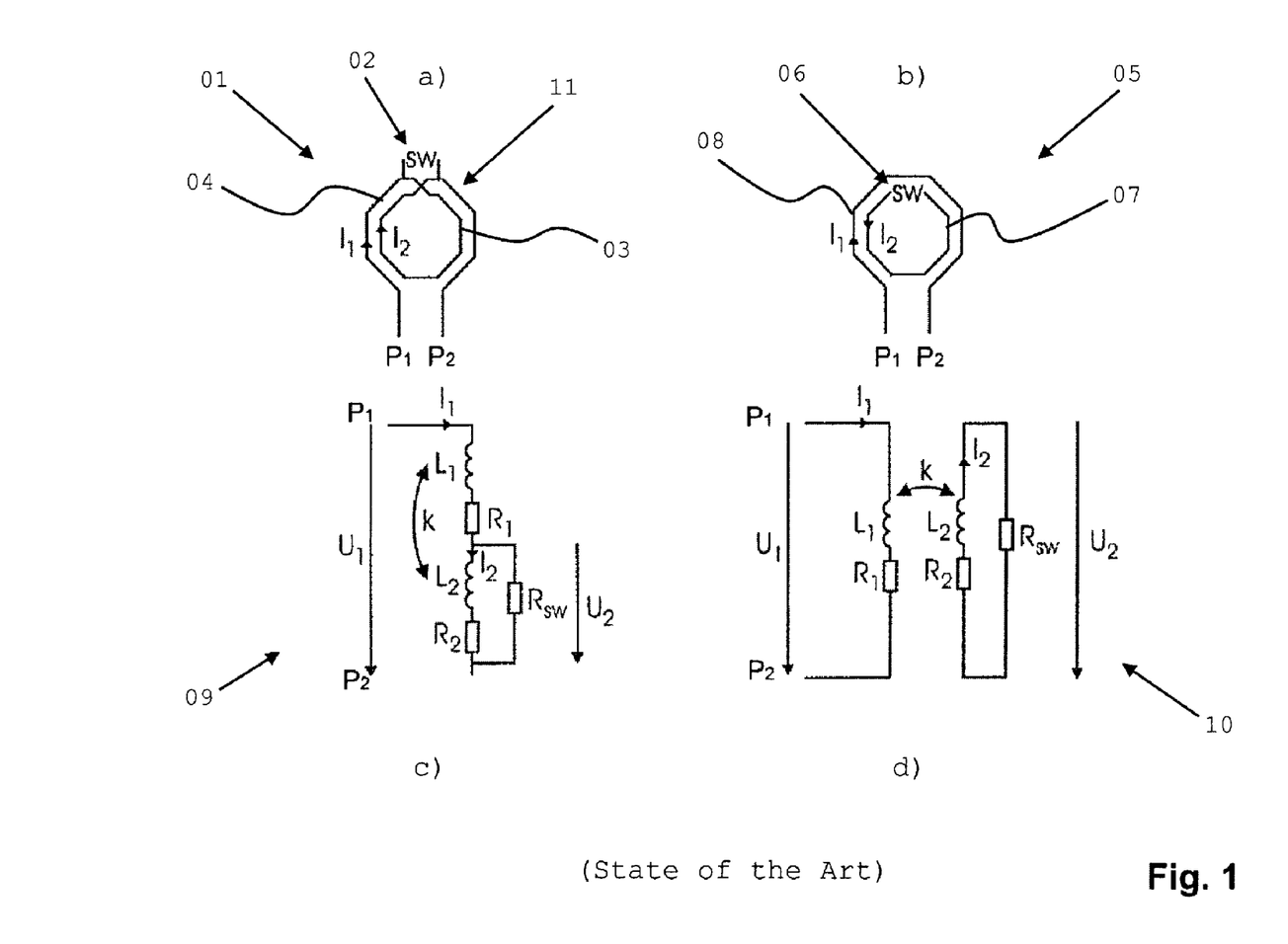
FIG. 1: showing schematical depictions and circuit diagrams of two prior-art types of switchable inductor coils.

There are two types of switchable inductors: either the switch is series-connected with the self-inductance coil or the switch is located within a secondary isolated coil. Both types of switchable inductors are shown in FIG. 1, wherein P1 and P2 denote outer ports of the switchable inductors.

In the switchable coil configuration 01 shown in FIG. 1a) the switch 02 is series-connected with the self-inductance coil 04. The switch 02 bypasses the inner coil winding 03 of the two-winding-coil 11. If the switch 02 is closed the current flows only in the outer winding 04, which is the primary coil 04 of the two-winding-coil 11, and the inner winding 03, which is the secondary coil 03 of the two-winding-coil 11, is short-circuited and disconnected from the outer winding 04. If the switch 02 is opened, the two-winding-coil 11 operates like a regular multi-turn coil because both coils 03 and 04 become series-connected.

In the switchable coil configuration 05 shown in FIG. 1b), the mutual inductance is switched, i.e. the switch 06 is located in the mutual inductance coil 07, which is the secondary coil 07. If the switch 06 in the secondary coil 07 is opened, only the self-inductance of the primary coil 08 contributes to the overall inductance. However if the switch 06 is closed, the current induced in the secondary coil 07 generates a mutual inductance that reduces the self-inductance of the primary coil 08 so that the overall inductance becomes smaller.

The two basic principles of switching an inductor coil can be analyzed based on the lumped element equivalent circuits 09, 10, which are shown in FIGS. 1c) and 1d). For equal coil geometries, despite being differently connected and closed switches, it can be shown that (a) the resulting overall inductance of both switchable coil configurations 01, 05 is the same but (b) the right-hand side inductor 05 and the switchable coil configuration 05 respectively has a higher quality factor.

The higher quality factor is caused by the fact that the switch resistance in the closed state does not get transformed one-to-one from the secondary coil 07 to the primary coil 08 in the right-hand side switchable inductor 05. This is in contrast to the left-hand side inductor 01 where the switch 02 is series-connected to the self-inductance coil 04 and therefore the switch resistance fully contributes to the resistive part of the inductor impedance.

U.S. Pat. No. 6,549,096 describes that the presence of one or more single loop windings positioned in proximity to the inductor decreases the magnetic field of an inductor. The single loop windings have open circuits that are selectively closed to magnetically couple the single loop windings to the inductor. Also, a switched inductor/varactor tuning circuit can be formed by connecting a varactor to the inductor such that different axial and coaxial arrangements of single and multi loop windings of primary and secondary coils could cause maximum magnetic field reduction when closing a loop switch and thus cause maximum inductance change. However, in such cases, the tuning range obtained by known inductor/varactor tuning circuit is limited and the step size of switched inductance is relatively coarse.

SUMMARY OF THE INVENTION

It is an object of the invention to present an inductor with a wide tuning range.

It is a further object of the invention to present an inductor with an improved granularity of switched inductance.

It is yet a further object of the invention to present an inductor with improved area consumption.

According to an aspect of the present invention, an inductor is provided. The inductor includes: a primary coil; at least one secondary coil having at least one loop winding with two open-circuited ports; at least one coupling coil having at least one loop winding with two open-circuited ports and a switch located between the two open-circuited ports which is arranged to selectively close the loop winding of at least one coupling coil; at least one passive coupling structure having at least one coupling coil arranged between the primary coil and the secondary coils and/or between two of the secondary coils; where the primary coil is coaxially arranged and operated in parallel to one or more isolated secondary coils and at least one coupling coil is radially displaced from the primary and one of the secondary coils so that the whole coupling coil is lying between adjacent loop windings of two of the secondary coils and/or between adjacent loop windings of the primary coil and one of the secondary coils. By passively coupling the primary coil and at least one secondary coil and/or at least two secondary coils, i.e. by magnetically coupling the primary coil and at least one secondary coil and/or at least two secondary coils when closing the switch between the open-circuited ports of a coupling coil, the mutual inductance of the inductor is changed and thus the overall inductance is varied in intermediate steps resulting in a finer granularity of tuning steps.

According to another aspect of the present invention, an inductor is provided. The inductor includes: a primary coil; at least one secondary coil having at least one loop winding with two open-circuited ports; at least one coupling coil having at least one loop winding with two open-circuited ports and a switch located between the two open-circuited ports which is arranged to selectively close the loop winding of at least one coupling coil; at least one active coupling structure; where the primary coil is coaxially arranged and operated in parallel to one or more isolated secondary coils and at least one active coupling structure is arranged between the primary coil and at least one secondary coil and/or between at least two secondary coils, to selectively parallel couple the primary coil and one of the secondary coils and/or to selectively parallel couple at least two of the secondary coils. By active parallel coupling of two coaxially arranged coils, i.e. by electrically parallel connecting the primary coil and at least one secondary coil and/or at least two secondary coils with each other, the inductance varies compared to the inductance of one of the coils as well as to the inductance of both coils. Thus, an intermediate inductance is generated allowing reduction of the step size of the switchable inductance. Therefore, a tunable inductor according to the invention provides a wide inductance tuning range by the application of active coupling structures between one primary coil and at least one secondary coil, and/or between at least two secondary coils. By parallel coupling of two coaxially arranged coils, the inductance varies compared to the inductance of one of the coils as well as to the inductance of both coils. Thus, an intermediate inductance is generated allowing reduction in the step size of the switchable inductance.

According to another aspect of the present invention, an inductor is provided. The inductor includes: a primary coil; at least one secondary coil having at least one loop winding with two open-circuited ports; at least one active coupling structure; where the primary coil is coaxially arranged and operated in parallel to at least one isolated secondary coil and at least one active coupling structure is arranged between the primary coil and at least one secondary coil and/or between at least two secondary coils, to selectively cross couple the primary coil and at least one secondary coil and/or to selectively cross couple at least two secondary coils. By active cross coupling of two coaxially arranged coils, like e.g. two secondary coils, i.e. by electrically cross connecting two coaxially arranged coils like e.g. the primary coil and at least one secondary coil and/or at least two secondary coils with each other, the inductance varies compared to the inductance of one of the coils as well as to the inductance of both coils. Thus an intermediate inductance is generated allowing to reduce the step size of the switchable inductance. An active coupling structure can be implemented e.g. by means of one or more switches.

According to another aspect of the present invention, a method is provided for operating an inductor by combining a primary and at least one secondary coil. The method includes a step selected from:

passively coupling the primary coil and the at least one secondary coil and/or at least two of the secondary coils by magnetically coupling the primary coil and the at least one secondary coil and/or at least two of the secondary coils;

actively parallel coupling the primary coil and the at least one secondary coil and/or at least two of the secondary coils by electrically parallel connecting the primary coil and the at least one secondary coil and/or at least two of the secondary coils; and actively cross coupling the primary coil and the at least one secondary coil and/or at least two the secondary coils by electrically cross connecting the primary coil and the at least one secondary coil and/or at least two of the secondary coils.

By cross coupling of two coaxially arranged coils, like e.g. two secondary coils, the inductance varies compared to the inductance of one of the coils as well as to the inductance of both coils. Thus an intermediate inductance is generated allowing to reduce the step size of the switchable inductance.

The foregoing, together with other objects, features, and advantages of this invention can be better appreciated with reference to the following specification, claims and drawings.

DETAILED DESCRIPTION OF THE PREFERRED EMBODIMENTS

Preferred embodiments of the invention are described in detail below, by way of example only, with reference to the following drawings.

Any disclosed embodiment can be combined with one or several of the other embodiments shown and/or described. This is also possible for one or more features of the embodiments.

According to an embodiment of the invention, at least one active coupling structure is arranged between the primary coil and at least one secondary coil and/or between at least two of the secondary coils, to selectively parallel couple the primary coil and at least one secondary coil and/or to selectively parallel couple at least two of the secondary coils.

By the active parallel coupling of two coaxially arranged coils, i.e. by electrically parallel connecting the primary coil and at least one secondary coil and/or at least two secondary coils with each other, the inductance varies compared to the inductance of one of the coils as well as to the inductance of both coils. Thus an intermediate inductance is generated allowing a reduction in the step size of the switchable inductance.

An active coupling structure can be implemented e.g. by means of one or more switches.

According to an embodiment of the invention, at least one active coupling structure is arranged between the primary coil and one of the secondary coils and/or between at least two of the secondary coils, to selectively cross couple the primary coil and at least one secondary coil and/or to selectively cross couple at least two of the secondary coils.

By active cross coupling of two coaxially arranged coils, like e.g. two secondary coils, i.e. by electrically cross connecting two coaxially arranged coils like e.g. the primary coil and at least one secondary coil and/or at least two secondary coils with each other, the inductance varies compared to the inductance of one of the coils as well as to the inductance of both coils. Thus an intermediate inductance is generated allowing reduction of the step size of the switchable inductance. Thus a tunable inductor according to the embodiment of the invention provides a wide inductance tuning range by an application of active and/or passive coupling structures between one or several secondary coils and/or one primary coil.

According to an embodiment of the invention, at least one phase shifting device is arranged between open-circuited ports of at least one secondary coil.

By arranging a phase shifting device between open-circuited ports of a secondary coil, the mutual inductance becomes a function of the phase shift and hence the phase shifting device allows the tuning of the overall inductance of the switchable inductor. Thus, if a phase shifter device is used to connect open-circuited ports of a secondary coil, a very fine tuning, i.e. a very fine inductance step size or—depending on the implementation of the phase shifter device—even a continuous variation of mutual inductance and thus of the overall inductance of the inductor can be achieved.

According to a further embodiment of the invention, a series connection of at least one phase shifting device and at least one active coupling structure is arranged between the open-circuited ports of at least one secondary coil and/or a coupling coil.

According to a further embodiment of the invention, a series connection of at least one phase shifting device and at least one active coupling structure is arranged between the open-circuited ports of at least one secondary coil and/or a coupling coil.

According to a further embodiment of the invention, where at least one phase shifting device is arranged in parallel to an active coupling structure between the open-circuited ports of at least one secondary coil and/or at least one coupling coil.

Because of the better quality factor performance for equal inductance value, the switchable inductor with wide tuning range having neither an active and/or passive coupling structure nor a phase shifting device series-connected to the primary coil applies the concept of switching mutual inductances to tune the overall inductance used in the LC-tank of an oscillator without switches that are series-connected to the self-inductance or primary coil.

By a combination of the above presented embodiments of the invention the shortcomings of the prior art are overcome and additional advantages can be provided through the provision of a switchable inductor including a primary self-inductance coil operated in parallel to one or a plurality of isolated secondary coils that reduce the overall inductance of the switchable inductor by the application of a) the application of coupling structures, i.e. passive coupling structures, within the secondary coils to reduce the step size of the switchable inductance and b) parallel-coupling switch constellations to obtain further tuning steps of the inductance, in particular coarse tuning steps, c) cross-coupling switch constellations to obtain further tuning steps of the inductance, in particular coarse tuning steps, d) the application of phase shifting devices within open-circuited ports of secondary coils and/or coupling coils to further reduce the inductance step size or in the extreme case to even continuously tune the overall inductance of the switchable inductor within a certain range. A continuously tunable inductor represents e.g. a varindor.

According to an embodiment of the invention the active coupling structures are arranged perpendicular or substantially perpendicular to the primary coil and to at least one secondary coil and/or to at least two secondary coils.

An active coupling structure can be implemented e.g. by means of one or more switches.

According to an embodiment of the invention, active coupling structures are arranged between the primary coil and at least one secondary coil and/or between at least two secondary coils, to selectively cross coupling the primary coil and at least one secondary coil and/or to selectively cross coupling at least two secondary coils.

By active cross coupling of two coaxially arranged coils, like e.g. two secondary coils, i.e. by electrically cross connecting two coaxially arranged coils like e.g. the primary coil and at least one secondary coil and/or at least two secondary coils with each other, the inductance varies compared to the inductance of one of the coils as well as to the inductance of both coils. Thus an intermediate inductance is generated allowing the reduction of the step size of the switchable inductance.

According to an embodiment of the invention, at least one passive coupling structure in form of at least one coupling coil is arranged between the primary coil and a secondary coil and/or between two secondary coils, the coupling coil including at least one loop winding with two open-circuited ports between which a switch is arranged to selectively close the loop winding of the coupling coil, wherein the coupling coil is not coaxially arranged to the primary and secondary coils, but radially displaced, so that the whole coupling coil is lying between adjacent loop windings of two secondary coils and/or between adjacent loop windings of the primary coil and a secondary coil.

By passively coupling the primary coil and at least one secondary coil and/or at least two secondary coils, i.e. by magnetically coupling the primary coil and at least one secondary coil and/or at least two secondary coils when closing the switch between the open-circuited ports of a coupling coil, the mutual inductance of the inductor is changed and thus the overall inductance is varied in intermediate steps resulting in a finer granularity of tuning steps.

According to an embodiment of the invention, at least one phase shifting device is arranged between open-circuited ports of at least one secondary coil.

By arranging a phase shifting device between open-circuited ports of a secondary coil the mutual inductance becomes a function of the phase shift and hence the phase shifting device allows to tune the overall inductance of the switchable inductor. Thus, if a phase shifter device is used to connect open-circuited ports of a secondary coil, a very fine tuning, i.e. a very fine inductance step size or, depending on the implementation of the phase shifter device, even a continuous variation of mutual inductance and thus of the overall inductance of the inductor can be achieved.

According to an embodiment of the invention a phase shifting device is arranged between the open-circuited ports of the coupling coil.

According to an embodiment of the invention, a series connection of at least one phase shifting device and at least one active coupling structure is arranged between the open-circuited ports of at least one secondary coil.

According to an embodiment of the invention, a phase shifting device is arranged in parallel to an active coupling structure between open-circuited ports of a secondary coil and/or a coupling coil.

According to an embodiment of the invention, the primary coil does neither include an active coupling structure nor a phase shifting device. In other words, neither an active coupling structure nor a phase shifting device is series-connected to the primary coil.

Because of the better quality factor performance for equal inductance value, the switchable inductor with wide tuning range having neither an active and/or passive coupling structure nor a phase shifting device series-connected to the primary coil applies the concept of switching mutual inductances to tune the overall inductance used in the LC-tank of an oscillator without switches that are series-connected to the self-inductance or primary coil.

By a combination of the above presented embodiments of the invention the shortcomings of the prior art are overcome and additional advantages can be provided through the provision of a switchable inductor including a primary self-inductance coil operated in parallel to one or a plurality of isolated secondary coils that reduce the overall inductance of the switchable inductor by the application of a) parallel-coupling switch constellations to obtain tuning steps of the inductance, in particular coarse tuning steps, b) cross-coupling switch constellations to obtain further tuning steps of the inductance, in particular coarse tuning steps, c) the application of additional coupling structures, i.e. passive coupling structures, within the secondary coils to reduce the step size of the switchable inductance and d) the application of phase shifting devices within open-circuited ports of secondary coils and/or coupling coils to further reduce the inductance step size or in the extreme case to even continuously tune the overall inductance of the switchable inductor within a certain range. A continuously tunable inductor represents e.g. a varindor.

According to an embodiment of the invention, active coupling structures are arranged between the primary coil and at least one secondary coil and/or between at least two secondary coils to selectively parallel couple the primary coil and at least one secondary coil and/or to selectively parallel couple at least two secondary coils.

By active parallel coupling of two coaxially arranged coils, i.e. by electrically parallel connecting the primary coil and at least one secondary coil and/or at least two secondary coils with each other, the inductance varies compared to the inductance of one of the coils as well as to the inductance of both coils. Thus an intermediate inductance is generated allowing the reduction of the step size of the switchable inductance.

According to an embodiment of the invention, at least one passive coupling structure in the form of at least one coupling coil is arranged between the primary coil and a secondary coil and/or between two secondary coils, the coupling coil including at least one loop winding with two open-circuited ports between which a switch is arranged to selectively close the loop winding of the coupling coil, wherein the coupling coil is not coaxially arranged to the primary and secondary coils, but radially displaced, so that the whole coupling coil is lying between adjacent loop windings of two secondary coils and/or between adjacent loop windings of the primary coil and a secondary coil.

By passive coupling the primary coil and at least one secondary coil and/or at least two secondary coils, i.e. by magnetically coupling the primary coil and at least one secondary coil and/or at least two secondary coils when closing the switch between the open-circuited ports of a coupling coil, the mutual inductance of the inductor is changed and thus the overall inductance is varied in intermediate steps resulting in a finer granularity of tuning steps.

Thus a tunable inductor according to the invention provides a wide inductance tuning range by the application of active and/or passive coupling structures between one or several secondary coils and/or one primary coil.

According to an embodiment of the invention, at least one phase shifting device is arranged between open-circuited ports of at least one secondary coil.

By arranging a phase shifting device between open-circuited ports of a secondary coil the mutual inductance becomes a function of the phase shift and hence the phase shifting device allows tuning of the overall inductance of the switchable inductor. Thus, if a phase shifter device is used to connect open-circuited ports of a secondary coil, a very fine tuning, i.e. a very fine inductance step size or, depending on the implementation of the phase shifter device, even a continuous variation of mutual inductance and thus of the overall inductance of the inductor can be achieved.

According to an embodiment of the invention, a phase shifting device is arranged between the open-circuited ports of the coupling coil.

According to an embodiment of the invention, a series connection of at least one phase shifting device and at least one active coupling structure is arranged between the open-circuited ports of at least one secondary coil and/or a coupling coil.

According to an embodiment of the invention, the phase shifting device is arranged in parallel to an active coupling structure between open-circuited ports of a secondary coil and/or a coupling coil.

According to an embodiment of the invention, the primary coil does neither include an active coupling structure nor a phase shifting device. In other words, neither an active coupling structure nor a phase shifting device is series-connected to the primary coil.

Because of the better quality factor performance for equal inductance value, the switchable inductor with wide tuning range having neither an active and/or passive coupling structure nor a phase shifting device series-connected to the primary coil applies the concept of switching mutual inductances to tune the overall inductance used in the LC-tank of an oscillator without switches that are series-connected to the self-inductance or primary coil.

By a combination of the above presented embodiments of the invention the shortcomings of the prior art are overcome and additional advantages can be provided through the provision of a switchable inductor including a primary self-inductance coil operated in parallel to one or a plurality of isolated secondary coils that reduce the overall inductance of the switchable inductor by the application of
a) cross-coupling switch constellations to obtain tuning steps of the inductance,
b) parallel-coupling switch constellations to obtain further tuning steps of the inductance,
c) the application of additional coupling structures, i.e. passive coupling structures, within the secondary coils to reduce the step size of the switchable inductance and
d) the application of phase shifting devices within open-circuited ports of secondary coils and/or coupling coils to further reduce the inductance step size or in the extreme case to even continuously tune the overall inductance of the switchable inductor within a certain range. A continuously tunable inductor represents e.g. a varindor.

An inductor according to an embodiment of the invention can provide a wide inductance tuning range by an application of active and passive coupling structures within one or several secondary coils and one primary coil.

Compared to the state of the art, a refinement of inductance tuning can be achieved by additionally using phase shifting devices between two open-circuited ports of secondary coils.

Figure 2:
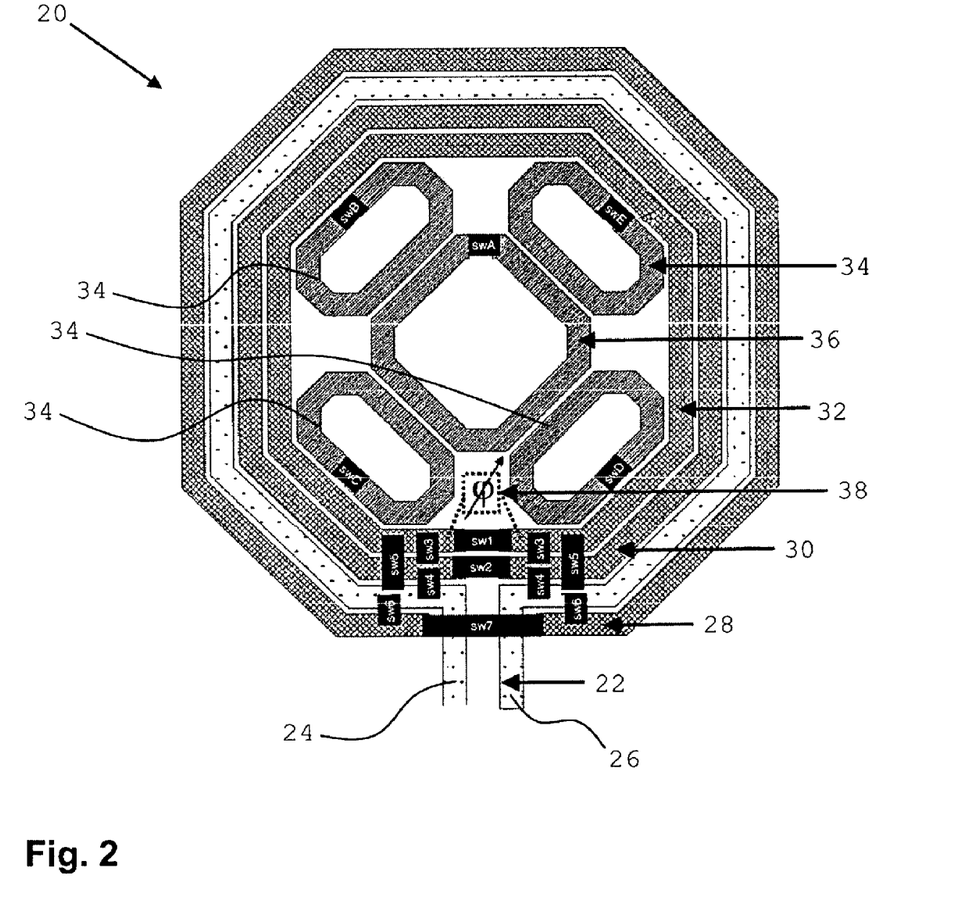
FIG. 2: showing a top view of a switchable inductor according to an embodiment of the invention including primary and secondary coils combined with active and passive coupling structures and phase shifting devices.

For convenience, an exemplary embodiment of a tunable inductor according to an embodiment of the invention is shown in FIG. 2. The switchable inductor 20 shown in FIG. 2 includes the following components. There is one primary coil 22 with ports 24 and 26 that are to be connected to a LC-tank or to a remaining part of a LC VCO, respectively. This primary coil 22 provides the self-inductance of the switchable inductor 20. In addition to the primary coil 22 there are one outer secondary coil 28 and a first and a second inner secondary coil 30, 32. These coils 28, 30, 32 contribute to the mutual inductance that reduces the self-inductance. The overall inductance seen at the ports 24 and 26 can be expressed as $$L = L_{primary\_coil} - \Sigma M_{secondary\_coils},$$

where M denotes the mutual inductance produced by the induced currents flowing in the secondary coils 28, 30, and 32.

In FIG. 2 only one outer secondary coil 28 is used because the magnetic flux defined as $$\Phi = \iint \vec{B} \cdot d\vec{S}$$

is primarily focused on the inner enclosed section of the primary coil as a result of the higher magnetic field B per area S.

The entirety of the three secondary coils 28, 30, 32 and the switches sw1 through sw7 provide a means to coarse tune the inductance of the switchable inductor 20. For reasons of Q-factor degradation as explained above none of the switches sw1 through sw7 is series connected to the primary coil 22.

There are several different switch constellations provided:

C1) The switches sw1, sw2, sw7 and swA are located between two open-circuited ports of a secondary coil 28, 30, 32, 36 winding. When such a switch sw1, sw2, sw7, swA is closed, the induced current can flow within the secondary coil 28, 30, 32, 36 and hence a mutual inductance is produced that reduces the self-inductance as explained above. If the switch sw1, sw2, sw7, swA is opened, no current can flow and the secondary coil 28, 30, 32, 36 does not contribute to the mutual inductance.

C2) The switches sw3 are arranged perpendicular or substantially perpendicular to the secondary coils 28, 30, 32 such that they can be used to switch some of them in parallel. When switch sw3 is closed, two secondary coils 30, 32 are operated in parallel—provided the pertinent switches sw1, sw2 are closed as well—which means that their mutual inductances add and above all the overall switch resistances transformed to the primary coil 22 become lower because of the parallel connection. This has a positive impact on the Q-factor. An example is given by the switch pair sw3. A pair of switches sw3 is used for the reason of symmetry with respect to the ports 24 and 26.

C3) The switches sw4, sw5, sw6 are arranged perpendicular or substantially perpendicular to the primary coil 22. When such a switch is closed, the secondary coil 28, 30, 32 is operated as a self-inductance coil and no longer as a mutual inductance coil. Examples are given by the switch pairs sw4, sw5 and sw6 in FIG. 2. The overall inductance reduces, ideally by a factor of two, as well as the resistive losses when one of the indicated switch pairs sw4, sw5 and sw6 is closed.

C4) An additional switching constellation is obtained when for instance sw5 is closed and the first inner secondary coil 30 is short-circuited by switch sw2. This configuration allows operating a mutual inductance coil, here the first inner secondary coil 30, in between two self-inductance coils, here the primary coil 22 and the second inner secondary coil 32. An analogous configuration can also be obtained when operating a self-inductance coil between two mutual inductance coils. This would for instance occur if the outer secondary coil 28 is connected in parallel to the first inner secondary coil 30. The switches required for this complementary case are however not included in FIG. 2 in order to keep the illustration simple.

Figure 8:
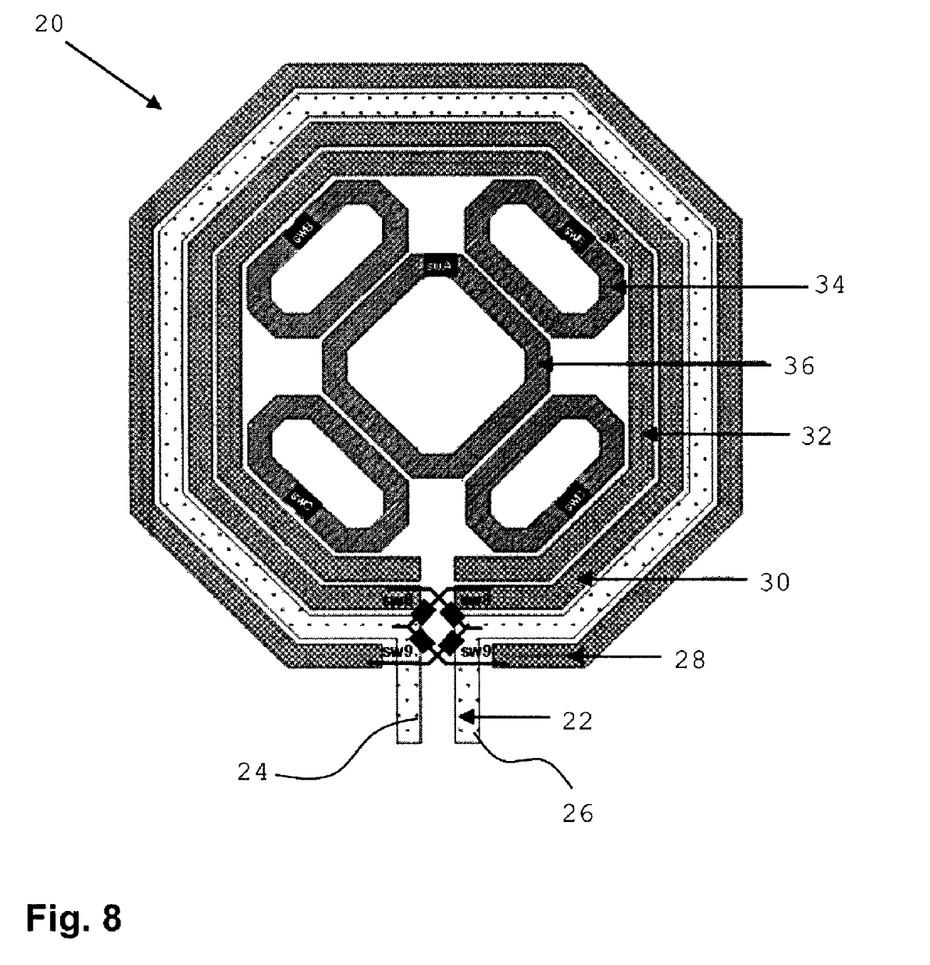
FIG. 8: showing a top view of a switchable inductor including of primary and secondary coils combined with active and passive coupling structures and extended with cross-connected or cross-coupled switches.

C5) Another switching constellation for the switchable inductor 20 of FIG. 2 is shown in FIG. 8, where two pairs of crossed switches sw8, sw9 connect the primary coil 22 with either the first inner secondary coil 30 or the first outer secondary coil 28. If for instance both switches sw8 are closed, the first inner secondary coil 30 becomes cross-coupled with the primary coil 22 with respect to the port definition and the coil geometries. The cross-connection forces the current injected into port 24 to be split into two parts to get to port 26. One part is still flowing in the primary coil 22 in clockwise direction whereas the other part is flowing in the secondary coil 30 in anti-clockwise direction. Because of the opposed flow directions the effect of reducing the self-inductance of the primary coil 22 by means of the superimposed mutual inductance gets pronounced as the increased mutual inductance not only stems from the magnetically induced current, similar to the magnetic coupling effect described at C1, but also comes from the directly injected current flowing in opposite direction. The same operation principle also applies to the configuration with the switches sw9 that cross-connect the primary coil 22 with the first outer secondary coil 28. The switches sw1 to sw7 are not shown in FIG. 8 to keep the illustration simple. All three kind of switches, i.e. the switches sw1, sw2, sw7 and swA short-circuiting the secondary coils 28, 30, 32, 36, the switches sw3, sw4, sw5, sw6 parallel switching coils 22, 28, 30, 32, and the switches sw8, sw9 cross connecting coils 22, 28, 30 within a switchable inductor can be combined in various combinations.

So far the discussed types of switching constellations according to C1) through C5) enable to vary the overall inductance seen at the ports 24 and 26 in relatively coarse steps.

Figure 3:
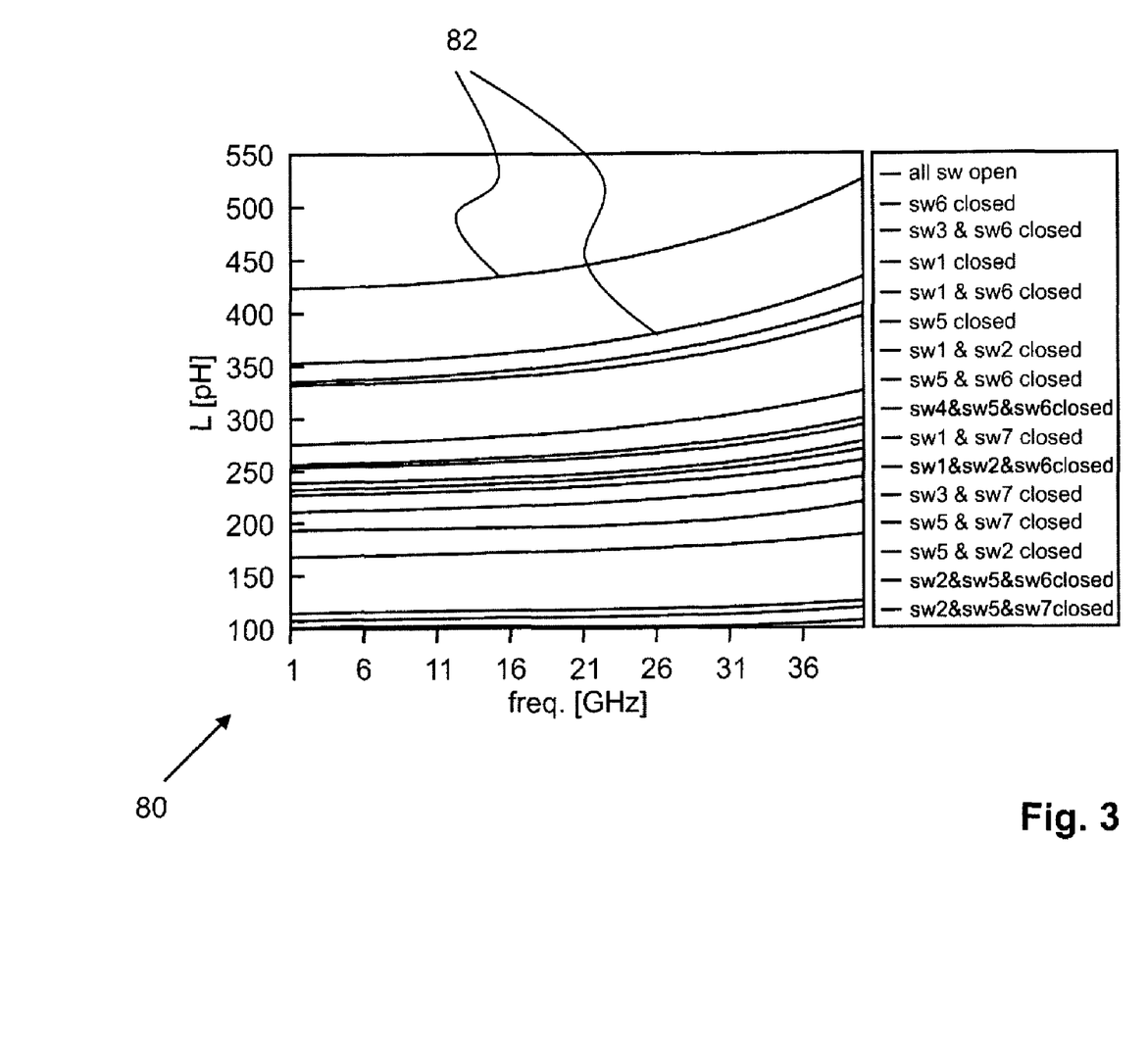
FIG. 3: showing a diagram with coarse inductance settings obtained for various switch combinations of the switchable inductor shown in FIG. 2.

An overview on the achievable inductances for the various switching constellations is given in FIG. 3 showing a diagram 80 with coarse inductance settings obtained for various switch combinations of the switchable inductor 20 shown in FIG. 2. The inductance curves 82 are derived from simulations of the switchable inductor 20 shown in FIG. 2.

Because of the relatively coarse inductance step sizes and the explanations made above about the quality factors of inductors and varactors, it might be desirable to reduce the inductance step size in favor of reducing the number of varactor banks in the LC-tank, which could increase the overall Q-factor of the LC-tank within a certain frequency range.

A method to reduce the inductance step size is given by the inner part of the switchable inductor shown 20 in FIG. 2. It includes of four switchable coupling coils 34 grouped around a third inner secondary coil 36. The idea behind these switchable coupling structures 34 is that they can either be used:

a) to couple a certain amount of mutual inductance generated within the more outer inner secondary coils, e.g. first and second secondary coil 30, 32, to the most inner secondary coil, e.g. the third secondary coil 36.

b) to contribute to the overall mutual inductance by themselves if the inner most secondary coil, e.g. the third secondary coil 36, is open-circuited and only one or more of the coupling coils 34 are closed.

In either case a relatively small variation of changes in mutual inductance can be obtained owing to the partitioning of the electromagnetic coupling into four different coupling coil structures 34. Each of the four coupling coil structures 34 shown in this example can maximally convey one quarter of the mutual inductance from the 2nd to the 3rd secondary coil 32, 36 or vice versa and therefore these coupling coil structures 34 are primarily used for fine tuning and for filling the gaps in between the coarse inductance step sizes.

Switches swA through swE are arranged within these coupling structures 34 (FIG. 2). If swA through swD are closed, the pertinent coupling coil structures 34 each form a closed loop and an induced current can build up a magnetic field that couples to the next closed secondary coil 32, 36. The switches swA and swD are independent of each other and can be successively closed or opened. The switch swE is of the same type as given at C1) described above.

If applied in combination to the switching constellations C1) through C4) described above, the coarse and fine inductance tuning superimposes and hence allows to reduce the inductance step size.

Figure 4:
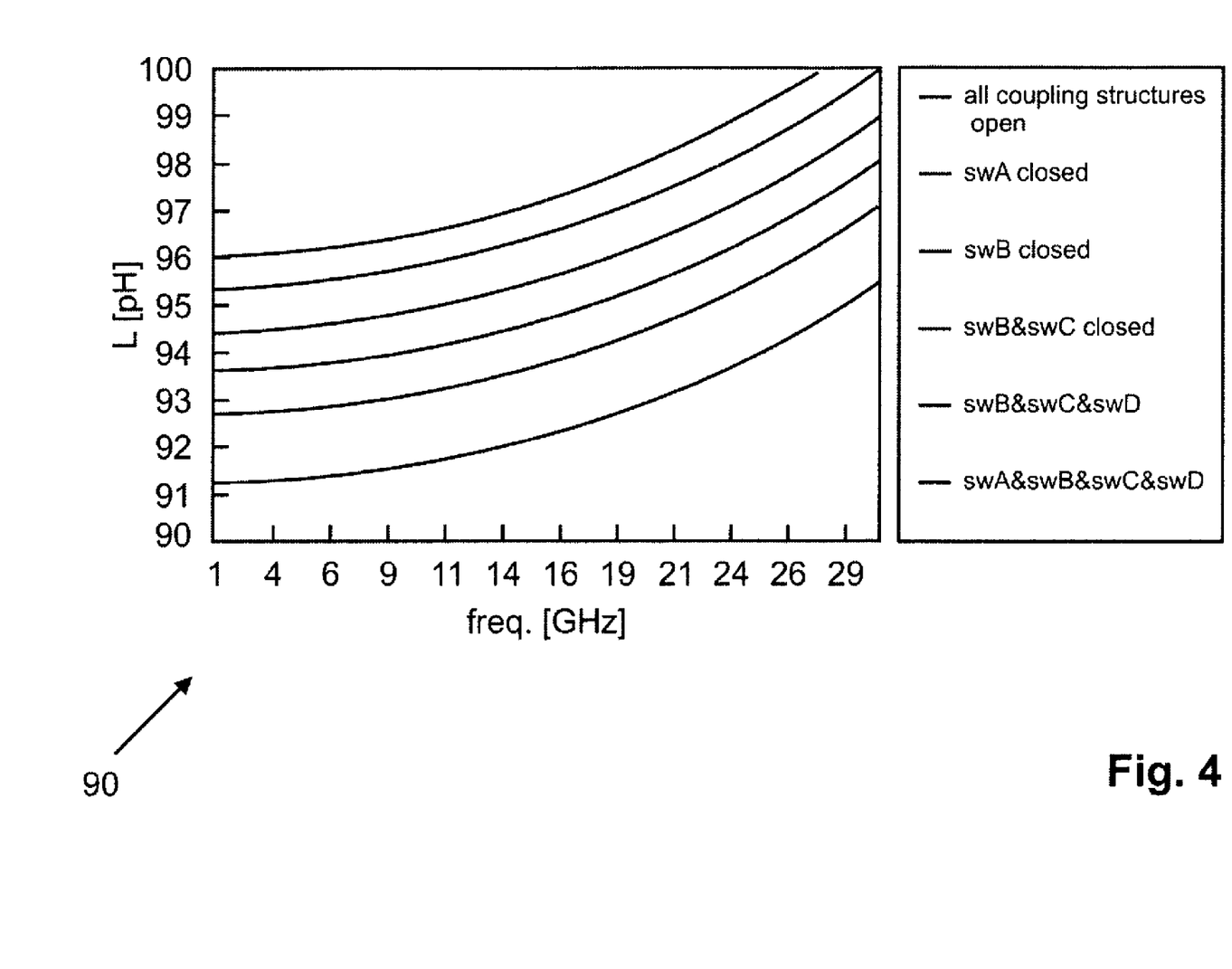
FIG. 4: showing a diagram with fine inductance step sizes obtained for various switch combinations of the coupling structures of the switchable inductor shown in FIG. 2.

An example of an inductance step size refinement using these additional coupling structures is given in FIG. 4, showing a diagram 90 with fine inductance step sizes obtained for various switch combinations of the coupling structures of the switchable inductor 20 shown in FIG. 2, where one of the lower inductor bands of the coarse tuning is further subdivided into smaller step sizes.

The method of using switches according to C1) through C5) to obtain a coarse inductance tuning can be referred to as active coupling. The method of using ring structures to couple between adjacent secondary loops can be referred to as passive coupling. This latter method allows to reduce the inductance step size and thus to implement a fine tuning of the overall inductance.

An alternative implementation of an inductor step size refinement is indicated in FIG. 2 by a dashed box 38 indicating a generic phase shifter 38, which is connected in parallel to sw1.

If a phase shifter 38 is used instead of switch sw1 to connect the open-circuited ports of e.g. the 2nd secondary coil 32, a very fine inductance step size or—depending on the actual implementation of the phase shifter 38—even a continuous variation of mutual inductance can be achieved. This can be explained by the vector of magnetic field given as $$\vec{B} = \mu \vec{H} \approx \frac{\mu I_2 \cdot \sin(\omega \cdot t + \varphi)}{2\pi r}\vec{e}_r$$

where $I_2$ is the induced sinusoidal electric current. If the phase of $I_2$ is changed by a series connected phase shifter 38 as indicated in the above formula by the phase shift $\varphi$ in the argument of the sin-function, the magnetic flux responsible for the mutual inductance also changes correspondingly.

Figure 5:
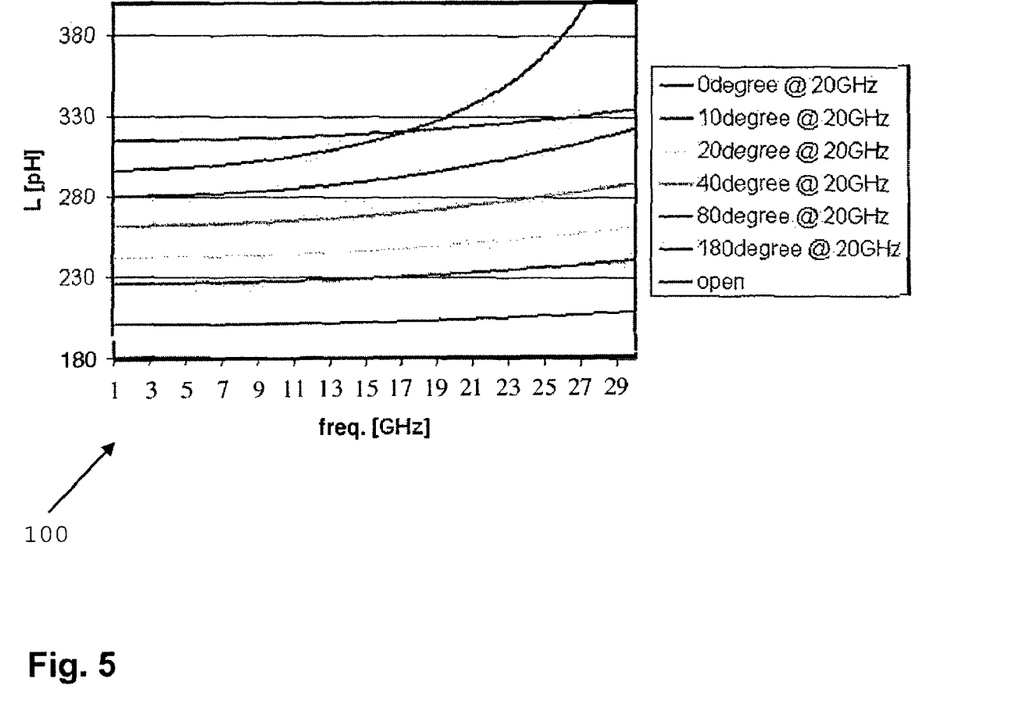
FIG. 5: showing a diagram with different inductance step sizes of the switchable inductor shown in FIG. 2 obtained for various amounts of phase shifts.

A simulation where the phase shifter 38 is represented by an ideal transmission line whose length is changed to obtain different phase shifts is shown in FIG. 5. Thereby FIG. 5 shows a diagram 100 with different inductance step sizes of the switchable inductor 20 shown in FIG. 2 obtained for various amounts of phase shifts.

Figure 6:
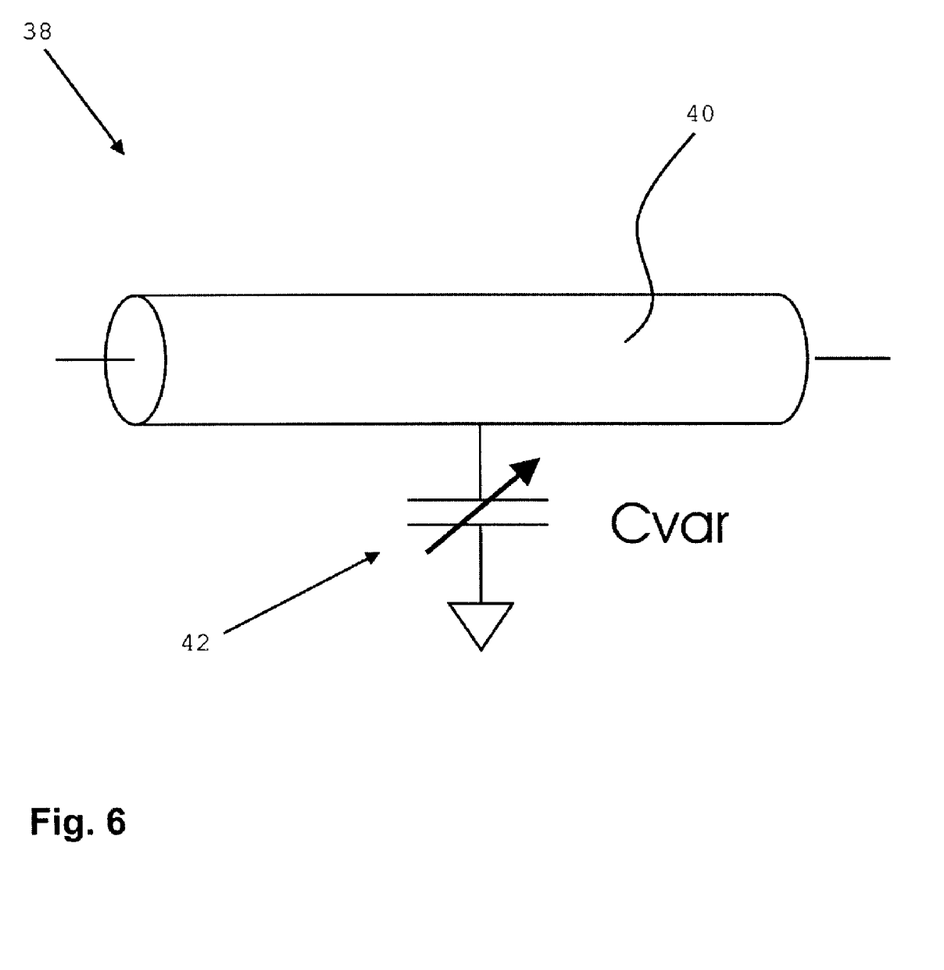
FIG. 6: showing a schematical depiction of a transmission line phase shifter.

An alternative implementation of an electrically tunable transmission line 40 phase shifter 38 is given in FIG. 6, where the amount of phase shifting is varied by the variation of the shunt-connected capacitance 42 in the middle of the transmission line 40.

The application of a phase shifter 38 is not restricted to the case shown in FIG. 2 and can be used in between any two ports of a secondary coil 28, 30, 32, 36, 34 where a switch sw7, sw2, sw1, swA, swB, swC, swD, swE is located in the embodiment described above.

Figure 7:
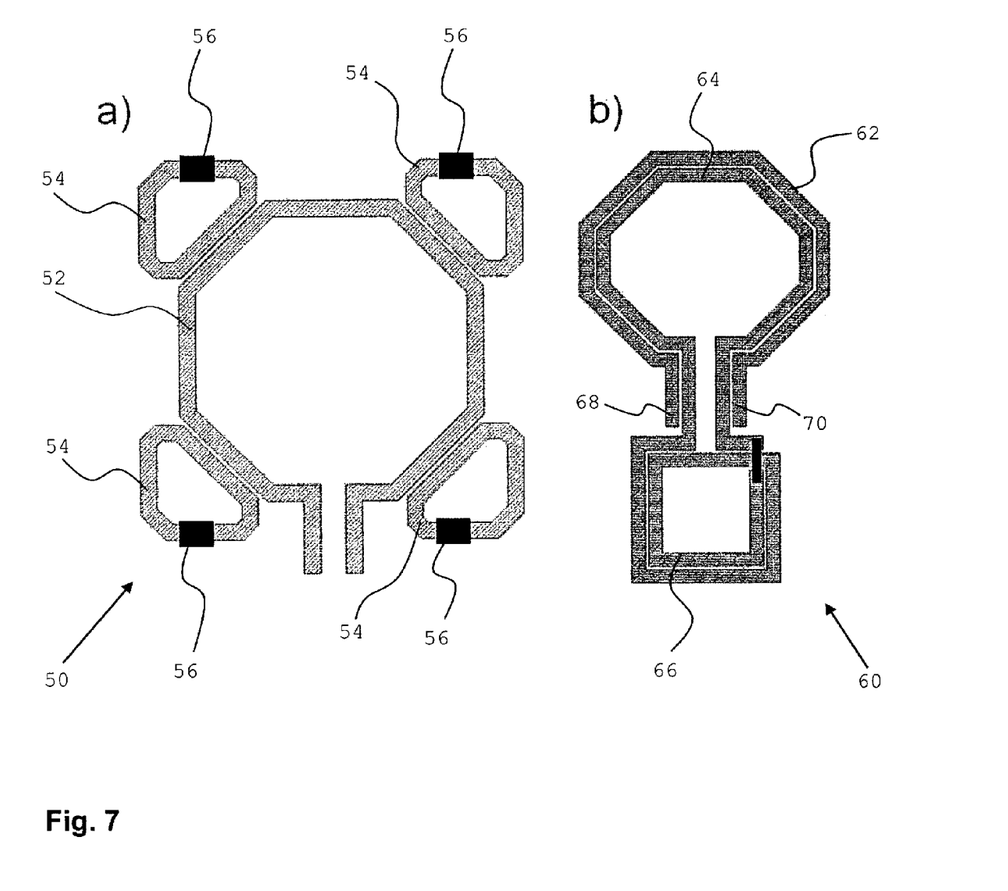
FIG. 7: showing schematical depictions of alternative implementations of switchable mutual inductances, with FIG. 7a) showing a primary coil with switchable coupling coils located in each of the four corners and FIG. 7b) showing a primary and a secondary coil where the later is additionally extended with a self-inductance coil.

FIG. 7 shows alternative implementations of switchable coils 50, 60. In the switchable coil 50 shown in FIG. 7*a*)

switchable coupling coils 54 are located in the corners of a primary coil 52. When the switches 56 get closed, each individual coupling coil 54 contributes to the mutual inductance according to the magnetic flux flowing through the area defined by its geometry.

In the switchable coil 60 shown in FIG. 7b a primary 62 and secondary coil 64 are depicted where the secondary coil 64 is additionally extended by a switchable self-inductance 66. The current induced by the mutual inductance between the primary 62 and secondary coil 64 also flows through the additional self-inductance coil 66. The amount of total mutual inductance seen in the secondary coil is therefore reduced by the amount of additional self-inductance. If the self-inductance coil 66 in the secondary loop 64 can be made tunable, this allows then to fine tune the overall mutual inductance and hence also to fine tune the overall inductance seen at ports 68 and 70.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. An inductor, comprising:
   a primary coil;
   at least one secondary coil having at least one loop winding with two open-circuited ports;
   at least one coupling coil having (i) at least one loop winding with two open-circuited ports and (ii) a switch located between said two open-circuited ports which is arranged to selectively close the loop winding of said at least one coupling coil; and
   at least one passive coupling structure having said at least one coupling coil arranged between said primary coil and at least one of said secondary coils and/or between two of said secondary coils;
   wherein (i) said primary coil is coaxially arranged and operated in parallel to said at least one secondary coil and (ii) said at least one coupling coil is radially displaced from said primary and one of said secondary coils so that the whole coupling coil is lying between adjacent loop windings of two of said secondary coils and/or between adjacent loop windings of said primary coil and one of said secondary coils;
   wherein at least one phase shifting device is arranged between said open-circuited ports of said least one coupling coil;
   wherein a series connection of said at least one phase shifting device and said at least one active coupling structure is arranged between said open-circuited ports of said at least one secondary coil and/or a coupling coil.

2. The inductor according to claim 1, wherein at least one active coupling structure is arranged between said primary coil and said at least one secondary coil and/or between at least two of said secondary coils, to selectively parallel couple the primary coil and at least one secondary coil and/or to selectively parallel couple at least two of said secondary coils.

3. The inductor according to claim 1, wherein at least one active coupling structure is arranged between said primary coil and one of said secondary coil and/or between at least two of said secondary coils, to selectively cross couple said primary coil and at least one secondary coil and/or to selectively cross couple at least two of said secondary coils.

4. The inductor according to claim 1, wherein said at least one phase shifting device is arranged in parallel to an active coupling structure between said open-circuited ports of said at least one secondary coil and/or said at least one coupling coil.

5. The inductor according to claim 1, wherein said at least one phase shifting device is arranged in parallel to an active coupling structure between said open-circuited ports of said at least one secondary coil and/or said at least one coupling coil.

6. An inductor, comprising:
   a primary coil;
   at least one secondary coil having at least one loop winding with two open-circuited ports;
   at least one coupling coil having (i) at least one loop winding with two open-circuited ports and (ii) a switch located between said two open-circuited ports which is arranged to selectively close the loop winding of said at least one coupling coil;
   at least one active coupling structure;
   wherein (i) said primary coil is coaxially arranged and operated in parallel to isolated said one or more secondary coils and (ii) said at least one active coupling structure is arranged between said primary coil and said at least one secondary coil and/or between at least two of said secondary coils, to selectively parallel couple said primary coil and one of said secondary coil and/or to selectively parallel couple at least two of said secondary coils;
   at least one passive coupling structure;
   at least on coupling coil having (i) at least loop winding with two open-circuited ports and (ii) a switch located between said two open-circuited ports which is arranged to selectively close the loop winding of said at least one coupling coil;
   wherein (i) said at least one passive coupling structure is in the form of at least one coupling coil, (ii) said at least one passive coupling structure is arranged between said primary coil and said at least one secondary coil and/or between two of said secondary coils and (iii) said at least one coupling coil radically displaced from said primary and one of said secondary coils, so that the whole coupling coil is lying between adjacent loop windings of two of said secondary coils and/or between adjacent loop windings of said primary coil and one of said secondary coils:
   wherein a phase shifting device is arranged between said open-circuited ports of said at least one coupling coil;
   wherein a series connection of said at least one phase shifting device and said at least one active coupling structure are arranged between said open-circuited ports of said at least one secondary coil and/or said least one coupling coil.

7. The inductor according to claim 6, wherein said at least one active coupling structure is arranged between said primary coil and at least one of said secondary coil and/or between at least two of said secondary coils, to selectively cross couple said primary coil and at least one of said secondary coil and/or to selectively cross couple at least two of said secondary coils.

8. The inductor according to claim 6, wherein said at least one phase shifting device is arranged in parallel to said at least one active coupling structure between said open-circuited ports of one of said secondary coils and/or one of said coupling coils.

9. An inductor, comprising:
   a primary coil;

at least one secondary coil having at least one loop winding with two open-circuited ports;

at least one coupling coil having (i) at least one loop winding with two open-circuited ports and (ii) a switch located between said two open-circuited ports which is arranged to selectively close the loop winding of said at least one coupling coil; and at least one passive coupling structure having said at least one coupling coil arranged between said primary coil and at least one of said secondary coils and/or between two of said secondary coils;

wherein (i) said primary coil is coaxially arranged and operated in parallel to said at least one secondary coil and (ii) said at least one coupling coil is radially displaced from said primary and one of said secondary coils so that the whole coupling coil is lying between adjacent loop windings of two of said secondary coils and/or between adjacent loop windings of said primary coil and one of said secondary coils;

wherein at least one phase shifting device is arranged between said open-circuited ports of said at least one secondary coil;

wherein a series connection of said at least one phase shifting device and said at least one active coupling structure is arranged between said open-circuited ports of said at least one secondary coil and/or a coupling coil.

10. An inductor, comprising:

a primary coil;

at least one secondary coil having at least one loop winding with two open-circuited ports;

at least one coupling coil having (i) at least one loop winding with two open-circuited ports and (ii) a switch located between said two open-circuited ports which is arranged to selectively close the loop winding of said at least one coupling coil;

at least one active coupling structure;

wherein (i) said primary coil is coaxially arranged and operated in parallel to isolated said one or more secondary coils and (ii) said at least one active coupling structure is arranged between said primary coil and said at least one secondary coil and/or between at least two of said secondary coils, to selectively parallel couple said primary coil and one of said secondary coil and/or to selectively parallel couple at least two of said secondary coils;

wherein at least one phase shifting device is arranged between said open-circuited ports of said at least one secondary coil;

wherein a series connection of said at least one phase shifting device and said at least one active coupling structure is arranged between said open-circuited ports of said at least one secondary coil and/or a coupling coil.

11. The inductor according to claim 10, wherein said at least one phase shifting device is arranged in parallel to said at least one active coupling structure between said open-circuited ports of one of said secondary coils and/or one of said coupling coils.

* * * * *